United States Patent
Huang et al.

(10) Patent No.: US 9,371,447 B2
(45) Date of Patent: Jun. 21, 2016

(54) CURABLE SILICONE RESIN COMPOSITION

(71) Applicant: BenQ Materials Corporation, Taoyuan (TW)

(72) Inventors: Ju-Hui Huang, Taoyuan (TW); Yu-Chin Chien, Taoyuan (TW)

(73) Assignee: BenQ Materials Corporation, Taoyuan (TW)

( * ) Notice: Subject to any disclaimer, the term of this patent is extended or adjusted under 35 U.S.C. 154(b) by 0 days.

(21) Appl. No.: 14/645,403

(22) Filed: Mar. 11, 2015

(65) Prior Publication Data
US 2015/0267053 A1 Sep. 24, 2015

(30) Foreign Application Priority Data

Mar. 18, 2014 (TW) .............................. 103110153 A

(51) Int. Cl.
C08L 83/04 (2006.01)
H01L 33/56 (2010.01)
C08G 77/12 (2006.01)
C08G 77/20 (2006.01)
C08G 77/00 (2006.01)

(52) U.S. Cl.
CPC ................. *C08L 83/04* (2013.01); *C08G 77/12* (2013.01); *C08G 77/20* (2013.01); *C08G 77/80* (2013.01); *H01L 33/56* (2013.01)

(58) Field of Classification Search
CPC ......... C08G 77/12; C08G 77/20; C08L 83/00
See application file for complete search history.

(56) References Cited

U.S. PATENT DOCUMENTS 5,844,060 A * 12/1998 Furuya .................. C08G 77/16 524/837

FOREIGN PATENT DOCUMENTS

| CN | 101 747 632 | * | 6/2010 |
| CN | 103003364 A | | 3/2013 |
| CN | 103180394 A | | 6/2013 |
| TW | 200524987 A | | 8/2005 |
| TW | 201022333 A1 | | 6/2010 |

OTHER PUBLICATIONS

CN 101 747 632 machine translation (2010).*

* cited by examiner

*Primary Examiner* — Kuo-Liang Peng
(74) *Attorney, Agent, or Firm* — CKC & Partners Co., Ltd.

(57) ABSTRACT

The disclosure provides a curable silicone resin composition, including 10 to 50 parts by weight of linear polysiloxane (A); 10 to 40 parts by weight of a first silicone resin (B1); 10 to 40 parts by weight of a second silicone resin (B2); and 15 to 25 parts by weight of a Si—H containing polysiloxane (C) having a general formula given as $HR^4_2SiO(SiR^3_2O)_nSiR^4_2H$, and a platinum group metal catalyst (D). The weight ratio of linear (A)/(the first silicone resin (B1)+the second silicone resin (B2)) is in the range of 0.1 to 2.0. The weight ratio of the first silicone resin (B1)/the second silicone resin (B2) is in the range of 0.2 to 4.0.

9 Claims, No Drawings

CURABLE SILICONE RESIN COMPOSITION

CROSS-REFERENCE TO RELATED APPLICATION

This application claims the priority benefit of Taiwanese application serial no. 103110153, filed on Mar. 18, 2014, the full disclosure of which is incorporated herein by reference.

BACKGROUND

1. Technical Field

The present invention relates to a curable silicone resin composition, which is used for encapsulating optical elements, semiconductor elements, COB (Chip on Board) or used as electrical insulation coating materials. More particularly, the curable silicone resin composition is applied for encapsulating light emitting diodes (LEDs) elements.

2. Description of Related Art

Comparing to typical lighting applications, LEDs have many advantages such as small dimension, high energy efficiency, long lifetime, more safety, faster response time, pure color, no heat radiation and no toxic substance like mercury, so that LEDs are applied extensively on architectural lighting, consumer portable lighting, retail display lighting and residential lighting.

The conventional LEDs packaging structure includes a metallic frame, a LED chip on the frame and an encapsulant to protect the LEDs from external environment damages. In general, a silver layer is coated under of the metallic frame, such as lead frame, for enhancing light utilization efficiency by reflecting the emission light back to the LED chips. However when using LEDs, the sulfur in the air would permeate through the encapsulant and then into the LEDs elements so that sulfur would react with the silver layer under the frame so as to produce black hydrogen sulfide ($H_2S$) which would decrease light emitting efficiency.

SUMMARY

According to aforementioned reasons, it is an object of the present invention to provide a curable silicone resin composition having sulfur-resistance for preventing occurrence of hydrogen sulfide ($H_2S$) so as to maintain LED emitting efficiency. Meanwhile, the curable silicone resin composition of the present invention also has superior characteristics such as high hardness, high refractive index, good flexibility, crack resistance and high heat resistance.

The curable silicone resin composition of the present invention includes 10 to 50 parts by weight of a linear polysiloxane (A) having at least one silicon bonded aryl group and at least two silicon bonded alkenyl groups in an average unit formula; 10 to 40 parts by weight of a first silicone resin (B1) having at least following siloxane units represented by the general formula: $(R^1SiO_{3/2})(R^1{}_2SiO_{2/2})$ in an average unit formula, wherein $R^1$ is an aryl group, a substituted or unsubstituted alkyl group or a substituted or unsubstituted alkenyl group; 10 to 40 parts by weight of a second silicone resin (B2) having at least following siloxane units represented by the general formula: $(R^2SiO_{3/2})(R^2{}_3SiO_{1/2})$ in an average unit formula, wherein $R^2$ is an aryl group, a substituted or unsubstituted alkyl group or a substituted or unsubstituted alkenyl group; 15 to 25 parts by weight of a Si—H containing polysiloxane (C) having a general formula given as $HR^4{}_2SiO(SiR^3{}_2O)_nSiR^4{}_2H$, wherein n is a positive number, $R^3$ is an aryl group, a substituted or unsubstituted alkyl group or a substituted or unsubstituted alkenyl group and $R^4$ is a substituted or unsubstituted alkyl group or a hydrogen atom; and a platinum group metal catalyst (D). The weight ratio of the linear polysiloxane (A)/(the first silicone resin (B1)+the second silicone resin (B2)) is in the range of 0.1 to 2.0 and the weight ratio of the first silicone resin (B1)/the second silicone resin (B2) is in the range of 0.2 to 4.0.

In a preferred embodiment of the present invention, the molar ratio of the silicon bonded aryl groups to all the silicon bonded organic groups excepting for end-capping groups in the linear polysiloxane (A) is not less than 0.4.

In a preferred embodiment of the present invention, the molar ratio of the silicon bonded aryl groups to all the silicon bonded organic groups excepting for end-capping groups in the first silicone resin (B1) is not less than 0.53.

In a preferred embodiment of the present invention, the molar ratio of the siloxane unit $R^1SiO_{3/2}$ to the siloxane unit $R^1{}_2SiO_{2/2}$ in the first silicone resin (B1) is in the range of 1 to 9.

In a preferred embodiment of the present invention, the molar ratio of the silicon bonded aryl groups to all the silicon bonded organic groups in the second silicone resin (B2) is not less than 0.25.

In a preferred embodiment of the present invention, the molar ratio of the silicon bonded alkenyl groups to all the silicon bonded organic groups in the second silicone resin (B2) is not less than 0.25.

In a preferred embodiment of the present invention, the weight ratio of the Si—H containing polysiloxane (C)/(the linear polysiloxane (A)+the first silicon resin (B1)+the second silicon resin (B2)) is in the range of 0.1 to 0.4.

In a preferred embodiment of the present invention, the platinum group metal catalyst (D) is present at an amount of 5 ppm to 50 ppm based on the total weight of the linear polysiloxane (A), the first silicon resin (B1), the second silicon resin (B2) and the Si—H containing polysiloxane (C) as 100 parts by weight.

In a preferred embodiment of the present invention, the curable silicon resin composition further includes an adhesion-imparting agent, a thixotropic agent, a hydrosilyation reaction inhibitor, fluorescent powders, an anti-setting agent, inorganic fillers or a combination thereof.

In a preferred embodiment of the present invention, an optical semi-conductor device, in which semiconductor elements are encapsulated with the curable silicon resin composition of the present invention.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details.

The present invention provides an encapsulant composed of a curable silicone resin composition. The curable silicone resin composition includes a linear polysiloxane, two types of silicone resins with different properties and adequate a Si—H containing polysiloxane to provide sulfur-resistance for preventing occurrence of hydrogen sulfide so as to maintain LEDs emitting efficiency. Meanwhile, the silicone resin composition of the present invention has superior characteristics such as high hardness, high refractive index, good flexibility, crack resistance and heat resistance.

The curable silicone resin composition of the present invention includes 10 to 50 parts by weight of a linear polysiloxane (A) having at least one silicon bonded aryl group and at least two silicon bonded alkenyl groups in an average unit formula; 10 to 40 parts by weight of a first silicone resin (B1) having at least following siloxane units represented by the general formula: $(R^1SiO_{3/2})(R^1{}_2SiO_{2/2})$ in an average unit formula, wherein $R^1$ is an aryl group, a substituted or unsubstituted alkyl group or a substituted or unsubstituted alkenyl group; 10 to 40 parts by weight of a second silicone resin (B2) having at least following siloxane units represented by the general formula: $(R^2SiO_{3/2})(R^2{}_3SiO_{1/2})$ in an average unit formula, wherein $R^2$ is an aryl group, a substituted or unsubstituted alkyl group or a substituted or unsubstituted alkenyl group; 15 to 25 parts by weight of a Si—H containing polysiloxane (C) having a general formula given as $HR^4{}_2SiO(SiR^3{}_2O)_nSiR^4{}_2H$, wherein n is a positive number, $R^3$ is an aryl group, a substituted or unsubstituted alkyl group or a substituted or unsubstituted alkenyl group and $R^4$ is a substituted or unsubstituted alkyl group or a hydrogen atom; and a platinum group metal catalyst (D). The weight ratio of the linear polysiloxane (A)/(the first silicone resin (B1)+the second silicone resin (B2)) is in the range of 0.1 to 2.0 and the weight ratio of the first silicone resin (B1)/the second silicone resin (B2) is in the range of 0.2 to 4.0.

In the curable silicone resin composition of the present invention, the linear polysiloxane (A) is used to improve workability between the first silicone resin (B1) and the second silicone resin (B2) in the manufacturing process. Further, the linear polysiloxane (A) could enhance flexibility of the cured silicone resin composition.

The linear polysilxoane (A) of the curable silicone resin composition has at least one silicon bonded aryl group and at least two silicon bonded alkenyl groups in an average unit formula. The aryl group used in the linear polysilxoane (A) is exemplified by phenyl, tolyl, xylyl or naphthyl, and more preferable is phenyl. Additionally, the alkenyl group used in the linear polysilxoane (A) is exemplified by vinyl, allyl, butenyl, pentenyl or hexenyl and more preferable is vinyl. Also, silicone bonded organic groups other than aryl groups or alkenyl groups are exemplified by substituted or unsubstituted alkyl group, such as methyl, ethyl, propyl, isopropyl, butyl, isobutyl, t-butyl, pentyl, neopentyl, n-hexyl, cyclohexyl, heptyl, octyl, nonyl or decyl, and more preferable is methyl.

In order to provide superior characteristics such as sulfur-resistance, heat resistance, high hardness and high refractive index of the curable silicone resin composition of the present invention, the molar ratio of the silicon bonded aryl groups to all the silicon bonded organic groups excepting for end-capping groups in the linear polysiloxane (A) is not less than 0.4.

Moreover, the linear polysiloxane (A) used in the curable silicone resin composition of the present invention is in the 10 to 50 parts by weight, preferably in the 20 to 34 parts by weight. If the linear polysiloxane (A) is used in an amount below the recommended lower limit, the mechanical strength of the cured silicone resin composition tends to decrease. On the other hand, if the linear polysiloxane (A) is used in an amount exceeds the recommended upper limit, the flexibility of the cured silicone resin composition will become worse.

Although, there are no limitations with regard to the viscosity of the linear polysiloxane (A), its viscosity at 25° C. should be preferably in the range of 6,000 mPa·s to 10,000 mPa·s. If the viscosity of the linear polysiloxane (A) exceeds the above mentioned range, the mechanical strength of the cured silicone resin composition will tend to decrease. If the viscosity of the linear polysiloxane (A) is below the mentioned range, the flexibility of the cured silicone resin composition will be worse. Further, regardless of the viscosity exceeds or below the above mentioned range, the workability would be influenced.

Moreover, concerning the workability and characteristics of the curable silicone resin composition, the weight average molecular weight of the linear polysiloxane (A) is in the range of 1,000 to 200,000, preferably in the range of 100 to 160,000. The weight average molecular weight is measured by the gel permeation chromatography (GPC) and be calculated relative to the reference polystyrene.

In a preferred embodiment of the present invention, the linear polysiloxane (A) is composed of the following average unit formula: $(PhMeSiO_{2/2})_{0.8}(Me_2SiO_{2/2})_{0.1}(ViMeSiO_{2/2})_{0.1}$ and the end-capping monomer, such as $(ViMe_2SiO_{1/2})$. The symbol "Ph" mentioned above represents phenyl, the symbol "Me" represents methyl and the symbol "Vi" represents vinyl. Further, the viscosity of the linear polysiloxane (A) in the embodiment is 6420 mPa·s at 25° C.

In the curable silicone resin composition of the present invention, the first silicone resin (B1) has at least following siloxane units represented by the general formula: $(R^1SiO_{3/2})(R^1{}_2SiO_{2/2})$ in an average unit formula, wherein $R^1$ is an aryl group, a substituted or unsubstituted alkyl group or a substituted or unsubstituted alkenyl group and $R^1$ can be the same or different. The aryl group used in the first silicone resin (B1) is exemplified by phenyl, tolyl, xylyl or naphthyl, and more preferable is phenyl. Additionally, the alkenyl group in the first silicone resin (B1) is exemplified by vinyl, allyl, butenyl, pentenyl or hexenyl and more preferable is vinyl. Also, silicone bonded organic groups other than aryl groups or alkenyl groups are exemplified by substituted or unsubstituted alkyl group, such as methyl, ethyl, propyl, isopropyl, butyl, isobutyl, t-butyl, pentyl, neopentyl, n-hexyl, cyclohexyl, heptyl, octyl, nonyl or decyl, and more preferable is methyl.

In order to provide superior characteristics such as sulfur-resistance, heat resistance and high hardness of the curable silicone resin composition of the present invention, the molar ratio of the silicon bonded aryl groups to all the silicon bonded organic groups excepting for end-capping groups in the first silicone resin (B1) is not less than 0.53. Moreover, in order to possess high hardness and good flexibility of the cured silicone resin composition in the same time and avoid cracking occurred, so that the molar ratio of the siloxane unit $R^1SiO_{3/2}$ to the siloxane unit $R^1{}_2SiO_{2/2}$ in the first silicone resin (B1) is in the range 1 to 9.

The first silicone resin (B1) used in the curable silicone resin composition of the present invention is in the 10 to 40 parts by weight, preferably in the 22 to 34 parts by weight. If the first silicone resin (B1) is used in an amount exceeds the recommended upper limit, the hardness of the cured silicone resin composition will be too high to cause crack. On the other hand, if the first silicone resin (B1) is used in an amount less than the recommended lower limit, the mechanical strength and hardness of the cured silicone resin composition will tend to decrease.

Moreover, concerning the workability and characteristics of the curable silicone resin composition, the weight average molecular weight of the first silicone resin (B1) is in the range of 500 to 200,000, preferably in the range of 1,000 to 190,000.

In a preferred embodiment of the present invention, the first silicone resin (B1) composed of the following average unit formula: $(PhSiO_{3/2})_{0.7}(Me_2SiO_{2/2})_{0.2}(ViMeSiO_{2/2})_{0.1}$ and the end-capping monomer, such as $(ViMe_2SiO_{1/2})$. Further, the first silicone resin (B1) in the embodiment is in the solid state at 25° C.

In the curable silicone resin composition of the present invention, the second silicone resin (B2) having at least following siloxane units represented by the general formula: $(R^2SiO_{3/2})(R^2{}_3SiO_{1/2})$ in an average unit formula, wherein $R^1$ is an aryl group, a substituted or unsubstituted alkyl group or a substituted or unsubstituted alkenyl group and $R^2$ can be the same or different. The aryl group used in the second silicone resin (B2) is exemplified by phenyl, tolyl, xylyl or naphthyl, and more preferable is phenyl. Additionally, the alkenyl group in the second silicone resin (B2) is exemplified by vinyl, allyl, butenyl, pentenyl or hexenyl and more preferable is vinyl. Also, silicone bonded organic groups other than aryl groups or alkenyl groups are exemplified by substituted or unsubstituted alkyl group, such as methyl, ethyl, propyl, isopropyl, butyl, isobutyl, t-butyl, pentyl, neopentyl, n-hexyl, cyclohexyl, heptyl, octyl, nonyl or decyl, and more preferable is methyl.

In order to provide superior characteristics such as sulfur-resistance, heat resistance, high hardness and high refractive index of the curable silicone resin composition of the present invention, the molar ratio of the silicon bonded aryl groups to all the silicon bonded organic groups in the second silicone resin (B2) is not less than 0.25. In addition, the specific amount of cross-linking functional groups are preferably used in the second silicone resin (B2) for enhance cross-linking density in the curable silicon resin composition so as to facilitate sulfur-resistance performance. Therefore, the molar ratio of the silicon bonded alkenyl groups to all the silicon bonded organic groups in the second silicone resin (B2) is not less than 0.25.

The second silicone resin (B2) used in the curable silicone resin composition of the present invention is in the 10 to 40 parts by weight, preferably in the 20 to 34 parts by weight. If the second silicone resin (B2) is used in an amount exceed the recommended upper and lower limit, the hardness tends to decrease and anti-sulfur performance of the cured silicone resin composition will be worse.

Moreover, concerning the workability and characteristics of the curable silicone resin composition, the weight average molecular weight of the second silicone resin (B2) is in the range of 100 to 10,000, preferably in the range of 500 to 5,000.

In a preferred embodiment of the present invention, the second silicone resin (B2) is composed of the following average unit formula: $(PhSiO_{3/2})_{0.5}(ViMe_2SiO_{1/2})_{0.5}$.

In brief, in the curable silicone resin composition of the present invention, the linear polysiloxane (A) should be used together with the first silicone resin (B1) and the second silicone resin (B2) for providing sulfur-resistance, high hardness, good flexibility, crack resistance and heat resistance thereof. If the linear polysiloxane (A) is not used, the hardness of the cured silicone resin composition will be too high to crack easily. Therefore, the weight ratio of the linear polysiloxane (A)/(the first silicone resin (B1)+the second silicone resin (B2)) is in the range of 0.1 to 2.0, preferably in the range of 0.3 to 0.6. Then, if the amount of first silicone resin (B1) or the second silicone resin (B2) is not used in a proper ratio, the sulfur-resistance will become worse and the hardness tends to decrease. Thus, the weight ratio of the first silicone resin (B1)/the second silicone resin (B2) is in the range of 0.2 to 4.0, preferably in the range of 0.6 to 1.7.

In the curable silicone resin composition of the present invention, the Si—H containing polysiloxane (C) have a general formula given as $HR^4_2SiO(SiR^3_2O)_nSiR^4_2H$, wherein n is a positive number, $R^3$ is an aryl group, a substituted or unsubstituted alkyl group and $R^3$ is the same or different and $R^4$ is a substituted or unsubstituted alkyl group or a hydrogen atom and $R^4$ is the same or different.

In order to provide superior characteristics such as heat resistance, high refractive index and high hardness of the curable silicone resin composition of the present invention, the molar ratio of the silicon bonded aryl groups to all the silicon bonded organic groups in the Si—H containing polysiloxane (C) is not less than 0.24.

The Si—H containing polysiloxane (C) used in the curable silicone resin composition of the present invention is in the 15 to 25 parts by weight, preferably in the 16 to 20 parts by weight. If the Si—H containing polysiloxane (C) is used in an amount exceeds the recommended upper limit, the hardness of the cured silicone resin composition will be too high to crack easily and anti-sulfur performance will become worse. On the other hand, if the Si—H containing polysiloxane (C) is used in an amount less than the recommended lower limit, incomplete cross-linking will be occurred and remaining unreacted vinyl groups in the curable resin composition will result into yellowing. Moreover, concerning the workability and characters of the curable silicone resin composition, the weight average molecular weight of the Si—H containing polysiloxane (C) is in the range of 10 to 5000, preferably in the range of 100 to 1000.

In a preferred embodiment of the present invention, the Si—H containing polysiloxane (C) is composed of the following average unit formula: $(Ph_2SiO_{2/2})_{0.33}(HMe_2SiO_{1/2})_{0.67}$.

In the curable silicone resin composition of the present invention, in order to make complete cross-linking so as to achieve the requirement hardness of the cured silicone resin composition, the weight ratio of the Si—H containing polysiloxane (C)/(the linear polysiloxane (A)+the first silicon resin (B1)+the second silicon resin (B2)) is in the range of 0.1 to 0.4, preferably in the range of 0.1 to 0.3.

In the curable silicone resin composition of the present invention, the platinum group metal catalyst (D) is such as a platinum-based metal catalyst, a rhodium-based metal catalyst or a palladium-based metal catalyst and the platinum-based metal catalyst is preferred. Some examples of platinum-based metal catalysts include $H_2PtCl_6 \cdot mH_2O$, $K_2PtCl_6$, $KHPtCl_6 \cdot mH_2O$, $K_2PtCl_4$, $K_2PtCl \cdot mH_2O$ and $PtO_2 \cdot mH_2O$ (wherein m represents a positive integer). In addition, the complexes of these platinum-based metal catalysts with hydrocarbons such as olefins, alcohol, or vinyl group-containing organopolysiloxane can also be used. These catalysts may be used either individually, or in combinations containing two or more different catalysts. The platinum-based metal catalyst (D) is present at an amount of 5 ppm to 50 ppm based on the total weight of the linear polysiloxane (A), the first silicone resin (B1), the second silicone resin (B2) and the Si—H containing polysiloxane (C) as 100 parts by weight, preferably at an amount of 4 ppm to 48 ppm.

In a preferred embodiment of the present invention, the platinum group metal catalyst (D) is (Platinum(0)-2,4,6,8-tetramethyl-2,4,6,8-tetravinylcyclotetrasiloxane complex solution) and that is present at an amount of 4.5 ppm to 6 ppm based on the total weight of the linear polysiloxane (A), the first silicon resin (B1), the second silicon resin (B2) and the Si—H containing polysiloxane (C) as 100 parts by weight.

Further, the curable silicone resin composition of the present invention may also include additives, but are not limited to, such as adhesion-imparting agent, a thixotropic agent, a hydrosilyation reaction inhibitor, fluorescent powders, an anti-setting agent, inorganic fillers or a combination.

The aforementioned adhesion-imparting agent is used to enhance the adhesive force between the curable silicone resin composition and frames or substrates. The adhesion-imparting agent is for example, such as 1,3,5-Tri-2-propenyl-1,3,5-triazine-2,4,6(1H,3H,5H)-trione, 1,3,5-triglycidyl-s-triazinetrione, Tris(3-trimethoxysilylpropyl)isocyanurate, other organosiloxane-modified isocyanurate compounds, 3-glycidoxypropyltrimethoxysilane, 2-(3,4-epoxycyclohexyl)ethyltriethoxysilane, (3-glycidyloxypropyl)triethoxysilane, or other similar organosiloxane-modified cyclo-compounds. Further, the adhesion-imparting agent is present at an amount of 0.5% to 3.0% based on the total weight of the linear polysiloxane (A), the first silicone resin (B1), the second silicone resin (B2) and the Si—H containing polysiloxane (C), preferably at an amount of 1.0% to 2.0%.

In a preferred embodiment of the present invention, the adhesion-imparting agent is tris(3-trimethoxysilylpropyl) isocyanurate and that is present at an amount of 1.29% to 1.67% based on the total weight of the linear polysiloxane (A), the first silicone resin (B1), the second silicone resin (B2) and the Si—H containing polysiloxane (C).

The aforementioned hydrosilyation reaction inhibitor is employed for providing the storage stability of the curable silicone resin composition of the present invention. The example of these hydrosilyation reaction inhibitor is such as 1-ethynycyclohexanol, 2-methyl-3-butyn-2-ol, 3,5-dimethyl-1-hexyn-3-ol, 2-phenyl-3-butyn-2-ol, 3-methyl-3-penten-1-yne or 3,5-dimethyl-3-hexen-1-yne. Further, the hydrosilyation reaction inhibitor is present at an amount of 100 ppm to 1000 ppm based on the total weight of the linear polysiloxane (A), the first silicon resin (B1), the second silicon resin (B2) and the Si—H containing polysiloxane (C), preferably at an amount of 125 ppm to 200 ppm.

In a preferred embodiment of the present invention, the hydrosilyation reaction inhibitor is 1-ethynycyclohexanol and that is present at an amount of 125 ppm to 174 ppm based on the total weight of the linear polysiloxane (A), the first silicone resin (B1), the second silicone resin (B2) and the Si—H containing polysiloxane (C).

The aforementioned thixotropic agent is used to improve and stabilize the thixotropic property of the curable silicone resin composition of the present invention. The thixotropic agents are such as BYK@-405, BYK@-R 605 or BYK@-R 606 that are available from BYK-CHEMIE in Germany.

The above mentioned fluorescent powders are used to adjust the colors emitted from LEDs. According to the required wavelength of the emission light, different types of fluorescent powders can be added into the curable silicone resin composition. For example, these fluorescent powders are such as cerium-doped yttrium aluminum garnet powder ($Y_3Al_5O_{12}$—Ce), aluminates, silicates, phosphates, nitrides or oxynitrides.

The aforementioned inorganic fillers are used to enhance the heat-resistance of the curable silicone resin composition and also be used as anti-setting agents for preventing the fluorescent powders from setting. Further, these inorganic fillers also can be used to reflect light. The inorganic fillers are for example, such as fumed silica, fumed titanium dioxide, calcium carbonate, calcium silicate, titanium dioxide, calcium oxide, or zinc oxide.

In the present invention, the curable silicone resin composition was cured at 60° C. to 150° C. for 1 hr to 5 hrs. However, according to different properties of curable silicone resin composition and the optical elements encapsulated thereby, the curing conditions can be, but not limited to. In another embodiment of the present invention, the curing condition is at 100° C. for 1 hr and than 150° C. for 4 hrs. In further embodiment of the present invention, the curing condition is at 60° C. for 1 hr, 100° C. for 1 hr and then 150° C. for 3 hrs.

The characteristics of the curable silicone resin composition of the present invention are measured according the following measuring method or tests and measurement results are listed in the table 2.

Appearance Test

After the curable silicone resin composition was cured, the appearance thereof is observed by visual to judge the cured curable silicone resin composition is transparent or discolored. The following designations were used to evaluation criteria: 「○」 is transparent, 「X」 is discolored.

Hardness Measurement

The Shore hardness of the cured silicone resin composition was measured by means of a durometer according to ASTMD2240.

Viscosity Measurement

The characteristic was measured by means of advanced Rheometer 2000 at 25° C. after the cured silicone resin composition has been centrifuged.

Refractive Index Measurement

The refractive index of the cured silicone resin composition was measured using an Abbe refractometer (ATAGO, DR-A1) at 25° C. Measurements are carried out with a light source of wavelength at 589 nm.

Glass transition temperature (Tg) and coefficient of thermal expansion measurement ($\alpha 2$)

The glass transition temperature (Tg) and the coefficient of thermal expansion $\alpha 2$ (ppm/° C.) of the cured silicone resin composition were measured with the use of a thermo mechanical analyzer, TMA (TAQ400). The measurement was carried out from −20° C. to 170° C., under load of 0.05 N. and the temperature raising rate was 40° C./min.

Sulfur-Resistance Test

Firstly, 0.3 g sulfur powder was set in the container of 120 ml. On the other hand, the curable silicone resin composition was dispensed on the lead frame of the surface mounted device (SMD), wherein a silver layer was coated on the other side thereof. Next, combine the sulfur powder-containing container and the SMD to form a sealed object, wherein the curable silicone resin composition was faced toward to the sulfur powder. Then, the sealed object was heated in the oven at 80° C. for 4 hrs. In final, the appearance of the silver layer was observed by visual to judge the cured curable silicone resin composition that was transparent or became black. The following designations were used to evaluation criteria: 「○」 the silver layer was transparent. 「x」 the silver layer became black.

Crack Resistance Test

The curable silicone resin composition was dispensed on the lead frame of the surface mounted device (SMD). Then, the SMD which has been encapsulated by the curable silicone resin composition was cured, after that, it was placed in a reliability testing instrument and the temperature and the humidity setting level thereof is MSL (Moisture Sensitivity Levels) 2a according to IPC/JEDEC's-J-STD-020c. Finally, the SMD which has been capsulated by the curable silicone resin composition was conducted reflow soldering process three times (the maximum temperature is 260° C. for 10 seconds). Then, the SMD which has been encapsulated by the curable silicone resin composition was taken out and dipped into the red ink for 1 hrs at room temperature. Use an optical microscope to observe whether or not the red ink permeated into the cured silicone resin composition on the lead frame. Each embodiment of the present invention has 10 testing samples. The following designations were used to evaluation criteria: 「○」: less than three testing sample have red ink permeation phenomenon. 「X」: more than three testing sample have red ink permeation phenomenon.

Heat Resistance Test

The curable silicone resin composition was set in an alumina mold and then was cured to from a cured product of 1 mm in thickness. The original transmittance (T0) at wavelength of 450 nm and original yellow index (Y0) of the cured product were measured by the means of a spectrophotometer (U4100, available from Hitachi). After the cured product set in the oven at temperature 200° C. for 72 hrs, the final transmittance (T1) at wavelength of 450 nm and final yellow index (Y1) thereof were measured. The variation ratio of transmittance (T1−T0/T0)*100% and variation of yellow index (Y1−Y0) were calculated.

The present invention will be explained in further detail with reference to the examples. However, the present invention is not limited to these examples.

Synthesis Example 1

The Manufacturing Method of Linear Polysiloxane (A)

3499.2 g (19.13 mole) of phenylmethyl dimethoxysilane (available from Chembridge International Corp., Taiwan), 288.48 g (2.4 mole) of dimethyldimethoxysilane (available from Chembridge International Corp., Taiwan) and 317.28 g (2.4 mole) of methylvinyldimethoxysilane (available from Union Chemical Ind. Co., Ltd, Taiwan) were mixed uniformly in a flask at room temperature to form a mixture. Then, the mixture was subsequently added dropwise to a solution of 5% sulfuric acid to form a reaction solution, after that, the reaction solution was heated to 75° C. so as to conduct hydrolysis reaction. Finally, the resulting reaction solution was extracted using of ionic water until the organic layer thereof became neutral. After the solvent of the organic layer was removed and the hydrolysis product was obtained.

The above hydrolysis product, 69.52 g of divinyltetramethyldisiloxane (available from Union Chemical Ind. Co., Ltd, Taiwan) and 5.88 g tetramethyl ammonium hydroxide (trade name is L09658 and is available from Alfa Aesar, US) were placed into a flask with stirring at room temperature under the nitrogen to form a reaction solution. Then, the reaction solution was heated to 95° C. to conduct the reaction. After carrying out the reaction, the produced salts were removed and the compound 1 was obtained.

The compound 1 was composed of siloxane units represented by the following formula: $(PhMeSiO_{2/2})_{0.8}(Me_2SiO_{2/2})_{0.1}(ViMeSiO_{2/2})_{0.1}$ in an average unit formula and an endcapping siloxane unit $ViMe_2SiO_{1/2}$.

Synthesis Example 2

The Manufacturing Method of the First Silicone Resin (B1)

2776 g (14 mole) of phenyltrimethoxysilane (available from Union Chemical Ind. Co., Ltd, Taiwan), 480.88 g (4 mole) of dimethyldimethoxysilane (available from Chembridge International Corp., Taiwan) and 264.46 g (2 mole) of methylvinyldimethoxysilane (available from Union Chemical Ind. Co., Ltd., Taiwan) were mixed uniformly in a flask at room temperature to form a mixture. Then, the mixture was subsequently added dropwise to a solution of 5% sulfuric acid to form a reaction solution, after that, the reaction solution was heated to 75° C. so as to conduct hydrolysis reaction. Finally, the reaction solution was extracted using of ionic water until the organic layer thereof became neutral. After the solvent of the organic layer was removed and the hydrolysis product was obtained.

The above hydrolysis product, 21.39 g (0.11 mole) of divinyltetramethyldisiloxane (Union Chemical Ind. Co., Ltd, Taiwan), 22.74 g of potassium hydroxide and 2274 g of toluene were placed into a flask with stirring at room temperature under the nitrogen to form a reaction solution. Then, the reaction solution was heated to 95° C. to conduct the reaction. After that, the reaction solution was extracted using of ionic water until the organic layer thereof became neutral. Finally, the solvent of the organic layer was removed and the compound 2 was obtained.

The compound 2 was composed of siloxane units represented by $(PhSiO_{3/2})_{0.7}(Me_2SiO_{2/2})_{0.2}(ViMeSiO_{2/2})_{0.1}$ in an average unit formula and an endcapping siloxane unit $ViMe_2SiO_{1/2}$.

Synthesis Example 3

Manufacturing Method of the Second Silicone Resin (B2)

2379.4 g (12 mole) of phenyltrimethoxysilane (available from Union Chemical Ind. Co., Ltd, Taiwan), 1118.4 g (6 mole) of divinyltetramethyldisiloxane (available from Union Chemical Ind. Co., Ltd, Taiwan) were mixed uniformly in a flask at room temperature to form a mixture. Then, the mixture was subsequently added dropwise to a solution of 5% sulfuric acid to form a reaction solution, after that, the reaction solution was heated to 75° C. so as to conduct hydrolysis reaction. After that, the reaction solution was extracted using of ionic water until the organic layer thereof became neutral. After the solvent of the organic layer was removed and the hydrolysis product was obtained.

The above hydrolysis product, 10 g of potassium hydroxide and 1998 g of toluene were placed into a flask with stirring at room temperature under the nitrogen to form a reaction solution. Then, the reaction solution was heated to 85° C. to conduct the reaction. After that, the reaction solution was extracted using of ionic water until the organic layer thereof became neutral. Finally, the solvent of the organic layer was removed and the compound 3 was obtained.

The compound 3 was composed of siloxane units represented by $(PhSiO_{3/2})_{0.5}(ViMe_2SiO_{1/2})_{0.5}$ in an average unit formula.

Synthesis Example 4

Manufacturing Method of a Si—H Containing Polysiloxane (C)

3432.04 g (14 mole) of diphenyldimethoxysilane (available from Union Chemical Ind. Co., Ltd, Taiwan), 1880.62 g (14 mole) of 1,1,3,3-Tetramethyldisiloxane (available from Chembridge International Corp., Taiwan) were mixed uniformly in a flask at room temperature to form a mixture. Then the mixture was subsequently added dropwise to a solution of 50% sulfuric acid to form a reaction solution. The reaction solution was stirred for 4 hrs at room temperature so as to conduct hydrolysis reaction. After that, the reaction solution was extracted using of ionic water until the organic layer thereof became neutral. Finally, the solvent of the organic layer was removed and the compound 4 was obtained.

The compound 4 was composed of siloxane units represented by $(Ph_2SiO_{2/2})_{0.33}(HMe_2SiO_{1/2})_{0.67}$ in an average unit formula.

Example 1

The Manufacturing Method of the Curable Silicone Resin Composition 33.75 parts by weight of compound 2, 22.5 parts by weight of compound 3 and 18.75 parts by weight compound 4 were mixed uniformly in a flask to form a first solution. 25 parts by weight of compound 1 and 6 ppm (based on the total weight of the compound 1, compound 2, compound 3 and compound 4) of Platinum(0)-2,4,6,8-tetramethyl-2,4,6,8-tetravinylcyclotetra-siloxane complex solution (trade name is 479543 and is available from Sigma-Aldrich) were mixed uniformly in a flask to form a second solution. Next, the first solution and the second solution were mixed uniformly with stirring at room temperature, and the curable silicone resin composition with a viscosity of 4859 mPa·s was obtained. Finally, the curable silicone resin composition was cured at 60° C. for 1 hr, 100° C. for 1 hr, and then 150° C. for 3 hrs.

Example 2

The Manufacturing Method of the Curable Silicone Resin Composition

The manufacturing method of Example 2 is the same as Example 1, except for the amount of each components and the curing condition. The curing condition of Example 2 was at 100° C. for 1 hr and then 150° C. for 4 hrs. The curable silicone resin composition with a viscosity of 4950 mPa·s was obtained.

For the purpose of different applications in optical elements, the curable silicone resin composition may include an adhesion-imparting agent, a thixotropic agent, a hydrosilyation reaction inhibitor, fluorescent powders, an anti-setting agent, inorganic fillers or a combination thereof to achieve the specific characters.

The Example 3 to Example 5 are application examples which are explained in detail as below.

Example 3

30 parts by weight of compound 2, 20 parts by weight of compound 3 and 16.68 parts by weight of compound 4, 173.3 ppm (based on the total weight of the compound 1, compound 2, compound 3 and compound 4) of 1-ethynychclohexanol (trade name is 119105000 and available from Acros, US) as hydrosilyation reaction inhibitor and 1.67% (based on the total weight of the compound 1, compound 2, compound 3 and compound 4) of Tris(3-trimethoxysilylpropyl)isocyanurate (trade name is 440825 and is available from Sigma-Aldrich) as adhesion-imparting agent were mixed uniformly in a flask to form a first solution. Then, 33.3 parts by weight of compound 1 and 6 ppm (based on the total weight of the compound 1, compound 2, compound 3 and compound 4) of Platinum(0)-2,4,6,8-tetramethyl-2,4,6,8-tetravinylcyclotetra-siloxane complex solution (trade name is 479543 and is available from Sigma-Aldrich) were mixed uniformly to form a second solution. Next, the first and the second solution were mixed with stirring at room temperature, and the curable silicone resin composition with a viscosity of 6350 mPa·s was obtained. Then, the curable silicone resin composition was cured at 60° C. for 1 hr, 100° C. for 1 hr, and then 150° C. for 3 hrs.

Example 4

The manufacturing method of Example 4 was the same as Example 3, except for the amount of each component. The viscosity of the curable silicone resin composition of Example 4 was 5430 mPa·s.

Example 5

The manufacturing method of Example 5 was the same as Example 3, except for the amount of each components. The viscosity of the curable silicone resin composition of Example 5 was 4950 mPa·s.

Comparative Example 1

56.25 parts by weight of compound 2 and 18.75 parts by weight of compound 4 were mixed in a flask to form a first solution. Then, 25 parts by weight of compound 1 and 6 ppm (based on the total weight of the compound 1, compound 2, compound 3 and compound 4) of Platinum(0)-2,4,6,8-tetramethyl 2,4,6,8-tetravinylcyclotetrasiloxane complex solution (trade name is 479543 and is available from Sigma-Aldrich) were mixed in a flask to form a second solution. Next, the first solution and the second solution were mixed with stirring at room temperature, and then cured at 60° C. for 1 hr, 100° C. for 1 hr, and then 150° C. for 3 hrs. The final cured silicone resin composition of Comparative Example 1 was obtained.

Comparative Example 2

45 parts by weight of compound 2, 30 parts by weight of compound 3 and 25 parts by weight of compound 4 and 6 ppm (based on the total weight of the compound 1, compound 2, compound 3 and compound 4) of Platinum(0)-2,4,6,8-tetramethyl-2,4,6,8-tetravinylcyclotetrasiloxane complex solution (trade name is 479543 and is available from Sigma-Aldrich) were mixed uniformly in a flask to form a first solution. Then, the first solution was stirred at room temperature and then was cured at 60° C. for 1 hr, 100° C. for 1 hr, and then 150° C. for 3 hrs. The final cured silicone resin composition of Comparative Example 2 was obtained.

Comparative Example 3

56.25 parts by weight of compound 3, 18.75 parts by weight of compound 4 were placed in a flask to form a first solution. 25 parts by weight of compound 1 and 6 ppm (based on the total weight of the compound 1, compound 2, compound 3 and compound 4) of Platinum(0)-2,4,6,8-tetramethyl-2,4,6,8-tetravinylcyclotetrasiloxane complex solution (trade name is 479543 and is available from Sigma-Aldrich) were placed in a flask to form a second solution. Then, the first solution and the second solution were mixed uniformly with stirring at room temperature and then was cured at 60° C. for 1 hr, 100° C. for 1 hr, and then 150° C. for 3 hrs. The final cured silicone resin composition of Comparative Example 3 was obtained.

Comparative Example 4

The manufacturing method of Comparative Example 4 was the same as Example 1, except for the amount of each components and the curing condition. The curing condition of Comparative Example 4 was at 60° C. for 1 hr, 100° C. for 1 hr, and then 150° C. for 3 hr.

The curable silicone resin composition of Example 1 to Example 5 and Comparative Example 1 to Comparative Example 4 were measured according to the measured methods mentioned above. The resulting data were listed in the Table 2.

It can be seen that the curable silicone resin composition manufactured from Example 1 to Example 5 are all transparent after appearance test. Besides, the hardness of Example 1 to Example 5 are all at least 72A, especially, Example 2 has extremely high hardness which achieves 53D. Further, the refractive index of Example 1 to Example 5 is 1.53. The glass transition temperatures of Example 1 to Example 5 are between 21° C. to 27° C. and the coefficient of thermal expansion thereof are smaller than 234 (ppm/° C.). Moreover, comparing with Comparative Example 1 to Comparative Example 4, Example 1 to Example 5 all have better performance on crack resistance and sulfur-resistance in the same time. Furthermore, in the heat resistance test, the transmittance variation ratio of Example 1 to Example 5 are about 3% and yellow index variation are smaller than 3. Therefore, according the present invention, the curable silicone resin composition has excellent characteristics such as high hardness, high refractive index, good flexibility, crack resistance and heat resistance.

While the invention has been described by way of example(s) and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

TABLE 1

The detailed components of Example 1 to Example 5 and Comparative Example 1 to Comparative Example 4

| | Example | | | | | Comparative example | | | |
|---|---|---|---|---|---|---|---|---|---|
| | 1 | 2 | 3 | 4 | 5 | 1 | 2 | 3 | 4 |
| Compound 1 | 25 | 20 | 33.3 | 28.57 | 25 | 25 | | 25 | 25 |
| Compound 2 | 33.75 | 30 | 30 | 26.78 | 22.5 | 56.25 | 45 | | 12.5 |
| Compound 3 | 22.5 | 30 | 20 | 26.78 | 33.75 | | 30 | 56.25 | 43.75 |
| Compound 4 | 18.75 | 20 | 16.68 | 17.85 | 18.75 | 18.75 | 25 | 18.75 | 18.75 |
| Platinum group metal catalyst | 6 ppm | 6 ppm | 6 ppm | 5.142 ppm | 4.5 ppm | 6 ppm | 6 ppm | 6 ppm | 6 ppm |
| Hydrosilyation reaction inhibitor | | | 173.3 ppm | 125 ppm | 125 ppm | | | | |
| Adhesion imparting agent | | | 1.67% | 1.29% | 1.35% | | | | |
| Remark | (1) Compound 1, compound 2, compound 3 and compound 4 are present by the parts by weight. (2) Platinum group metal catalyst: Platinum(0)-2,4,6,8-tetramethyl-2,4,6,8-tetravinylcyclotetra-siloxane complex solution (The amount used based on the total weight of the compound 1, compound 2, compound 3 and compound 4) (3) Hydrosilyation reaction inhibitor: 1-ethynychclohexanol (The amount used based on the total weight of the compound 1, compound 2, compound 3 and compound 4) (4) Adhesion-imparting agent: tris(3-trimethoxysilylpropyl)isocyanurate (The amount used based on the total weight of the compound 1, compound 2, compound 3 and compound 4) | | | | | | | | |

TABLE 2

The measured data of Example 1 to Example 5 and Comparative Example 1 to Comparative Example 4

| | Example | | | | | Comparative Example | | | |
|---|---|---|---|---|---|---|---|---|---|
| | 1 | 2 | 3 | 4 | 5 | 1 | 2 | 3 | 4 |
| Appearance | ○ | ○ | ○ | ○ | ○ | ○ | ○ | ○ | ○ |
| Hardness(Shore) | 89A | 53D | 72 A | 72 A | 73A | 24-26A | 72D | 38-40A | 54-55A |
| Refractive index | 1.53 | 1.53 | 1.53 | 1.53 | 1.53 | 1.53 | 1.53 | 1.53 | 1.53 |
| Glass transition temperature (Tg) (° C.) | 23.82 | 23.00 | 21.45 | 26.56 | 25.43 | 46.57 | 27.65 | 28.56 | 31.38 |
| Coefficient of thermal expansion ($\alpha 2$) (ppm/° C.) | 221.2 | 219.3 | 233.5 | 229.6 | 227.4 | 379.4 | 215.5 | 232.9 | 220.1 |
| Sulfur-resistance test | ○ | ○ | ○ | ○ | ○ | x | ○ | x | x |
| Crack resistance test | ○ | ○ | ○ | ○ | ○ | x | x | ○ | x |
| Heat resistance test | | | | | | | | | |
| Original transmittance T0 (%) | 89.99 | 90.08 | 89.54 | 89.40 | 89.82 | 89.75 | 89.48 | 90.45 | 90.26 |
| Final transmittance T1 (%) | 88.77 | 89.13 | 86.97 | 86.68 | 87.11 | 89.60 | 88.44 | 87.62 | 89.19 |
| Transmittance variation ratio (%) | 1.35 | 1.05 | 2.87 | 3.08 | 3.01 | 0.17 | 1.16 | 3.13 | 1.19 |
| Original yellow index (Y0) | 0.9 | 0.8 | 1.1 | 1.0 | 1.0 | 0.8 | 1.0 | 0.7 | 0.7 |
| Final yellow index (Y1) | 1.7 | 2.1 | 3.9 | 3.9 | 3.8 | 2.1 | 2.4 | 3.4 | 2.2 |
| Yellow index variation | 0.8 | 1.3 | 2.5 | 2.9 | 2.8 | 1.3 | 1.4 | 2.7 | 1.5 |

What is claimed is:

1. A curable silicone resin composition, comprising:
   10 to 50 parts by weight of a linear polysiloxane (A) having at least one silicon bonded aryl group and at least two silicon bonded alkenyl groups in an average unit formula;
   10 to 40 parts by weight of a first silicone resin (B1) having at least following siloxane units represented by the general formula: $(R^1SiO_{3/2})(R^1_2SiO_{2/2})$ in an average unit formula, wherein $R^1$ is an aryl group, a substituted or unsubstituted alkyl group or a substituted or unsubstituted alkenyl group;
   10 to 40 parts by weight of a second silicone resin (B2) having at least following siloxane units represented by the general formula: $(R^2SiO_{3/2})(R^2_3SiO_{1/2})$ in an average unit formula, wherein $R^2$ is an aryl group, a substituted or unsubstituted alkyl group or a substituted or unsubstituted alkenyl group;
   15 to 25 parts by weight of a Si—H containing polysiloxane (C) having a general formula given as $HR^4_2SiO(SiR^3_2O)nSiR^4_2H$, wherein n is a positive number, $R^3$ is an aryl group, a substituted or unsubstituted alkyl group or a substituted or unsubstituted alkenyl group and $R^4$ is a substituted or unsubstituted alkyl group or a hydrogen atom; and
   a platinum group metal catalyst (D);
   wherein a weight ratio of the linear polysiloxane (A)/(the first silicone resin (B1)+the second silicone resin (B2)) is in the range of 0.1 to 2.0 and a weight ratio of the first silicone resin (B1)/the second silicone resin (B2) is in the range of 0.2 to 4.0.

2. The curable silicone resin composition according to claim 1, wherein the molar ratio of the silicon bonded aryl groups to all the silicon bonded organic groups excepting for end-capping groups in the linear polysiloxane (A) is not less than 0.4.

3. The curable silicon resin composition according to claim 1, wherein the molar ratio of the silicon bonded aryl groups to all the silicon bonded organic groups excepting for end-capping groups in the first silicone resin (B1) is not less than 0.53.

4. The curable silicon resin composition according to claim 1, wherein the molar ratio of the silicon bonded aryl groups to all the silicon bonded organic groups in the second silicone resin (B2) is not less than 0.25.

5. The curable silicon resin composition according to claim 1, wherein the molar ratio of the silicon bonded alkenyl groups to all the silicon bonded organic groups in the second silicone resin (B2) is not less than 0.25.

6. The curable silicon resin composition according to claim 1, wherein the weight ratio of the Si—H containing polysiloxane (C)/(the linear polysiloxane (A)+the first silicon resin (B1)+the second silicon resin (B2)) is in the range of 0.1 to 0.4.

7. The curable silicon resin composition according to claim 1, wherein the platinum group metal catalyst (D) is present at an amount of 5 ppm to 50 ppm based on the total weight of the linear polysiloxane (A), the first silicon resin (B1), the second silicon resin (B2) and the Si—H containing polysiloxane (C) as 100 parts by weight.

8. The curable silicon resin composition according to claim 1, further includes an adhesion-imparting agent, a thixotropic agent, a hydrosilyation reaction inhibitor, fluorescent powders, an anti-setting agent, inorganic fillers or a combination thereof.

9. An optical semiconductor device, in which semiconductor elements are encapsulated with the curable silicon resin composition according to claim 1.

* * * * *